United States Patent
Haidner et al.

(10) Patent No.: US 7,417,745 B2
(45) Date of Patent: Aug. 26, 2008

(54) DEVICE AND METHOD FOR WAVEFRONT MEASUREMENT OF AN OPTICAL IMAGING SYSTEM BY MEANS OF PHASE-SHIFTING INTERFEROMETRY

(75) Inventors: Helmut Haidner, Aalen (DE); Wolfgang Emer, Aalen (DE); Rainer Hoch, Aalen (DE); Ulrich Wegmann, Koenigsbronn (DE); Martin Schriever, Aalen (DE); Markus Goeppert, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 284 days.

(21) Appl. No.: 10/816,896

(22) Filed: Apr. 5, 2004

(65) Prior Publication Data

US 2005/0007602 A1 Jan. 13, 2005

(30) Foreign Application Priority Data

Apr. 4, 2003 (DE) ................................ 103 16 123

(51) Int. Cl.
*G01B 9/02* (2006.01)
(52) U.S. Cl. ....................................... 356/515; 356/521
(58) Field of Classification Search ......... 356/511–515, 356/520, 521
See application file for complete search history.

(56) References Cited

U.S. PATENT DOCUMENTS 6,239,878 B1 * 5/2001 Goldberg .................... 356/520
6,307,635 B1 * 10/2001 Goldberg .................... 356/521
6,573,997 B1 * 6/2003 Goldberg et al. ............ 356/521
7,088,458 B1 * 8/2006 Wegmann .................... 356/515
2002/0001088 A1 1/2002 Wegmann et al.

FOREIGN PATENT DOCUMENTS

DE 36 50 220 T2 3/1986
DE 101 09 929 A1 11/2001

* cited by examiner

*Primary Examiner*—Hwa S Lee (Andrew)
(74) *Attorney, Agent, or Firm*—Sughrue Mion, PLLC

(57) ABSTRACT

Device and method for wavefront measurement of an optical imaging system by means of phase-shifting interferometry, having a mask structure (6a) to be arranged on the object side, and/or a grating structure (7a) to be arranged on the image side. The object-side mask structure includes one or more one-dimensional mask structure patterns, and the image-side grating structure includes one or more two-dimensional grating structure patterns. Alternatively, conversely, the mask structure includes one or more two-dimensional patterns, and the grating structure includes one or more one-dimensional patterns. Additionally or alternatively, a pupil position offset caused by a lateral relative movement of the mask structure and detector element can be taken into account by back calculating the interferogram, respectively recorded by the detector element, using an associated phase-shift characteristic, or by a computational correction of wavefront derivatives, obtained from the recorded interferograms, in the direction of lateral movement. The method and/or the device can by used, for example, for determining aberration in the case of high-resolution projection objectives of microlithography exposure machines using shearing or point interferometry.

4 Claims, 5 Drawing Sheets

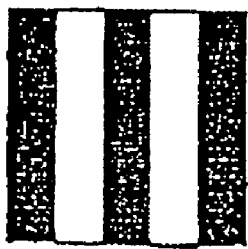
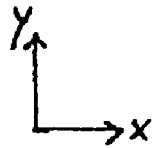
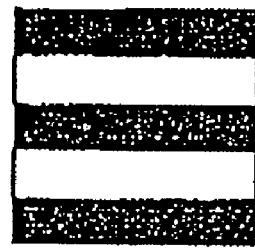
Fig. 6
Fig. 7
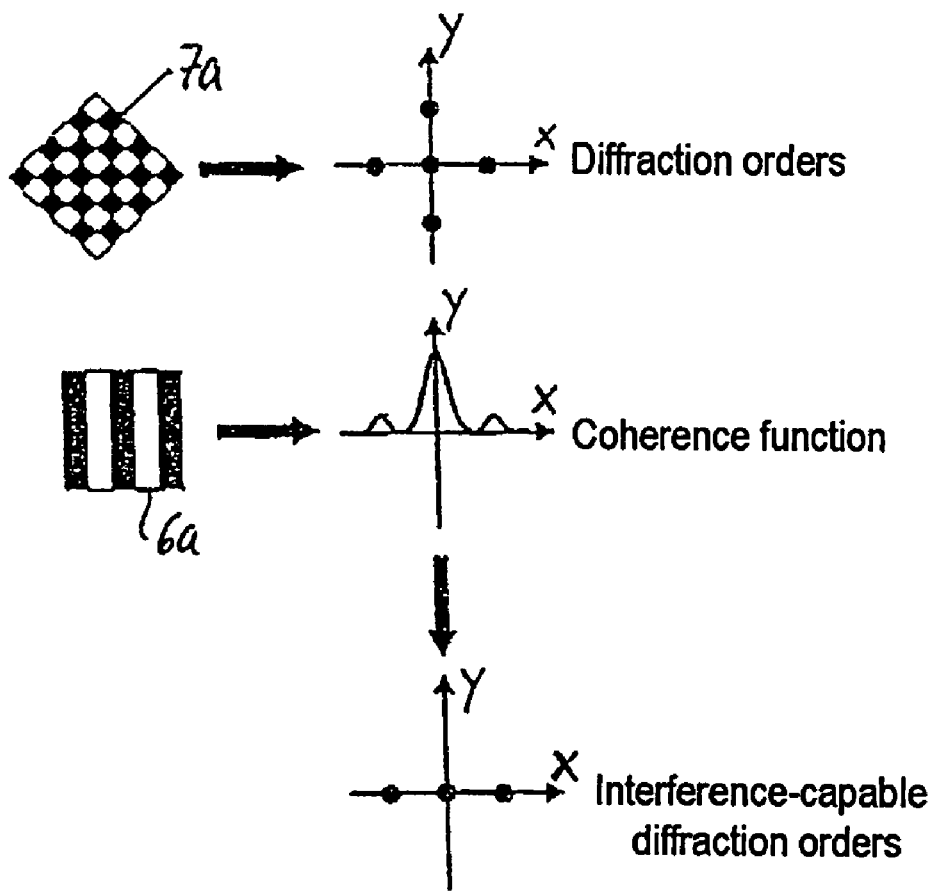
Fig. 8

DEVICE AND METHOD FOR WAVEFRONT MEASUREMENT OF AN OPTICAL IMAGING SYSTEM BY MEANS OF PHASE-SHIFTING INTERFEROMETRY

The following disclosure is based on German Patent Application No. 103 16 123.6 filed on Apr. 4, 2003, which is incorporated into this application by reference.

FIELD OF THE INVENTION

The invention relates to a device for wavefront measurement of an optical imaging system by means of a phase-shifting interferometry technique, having a mask structure to be arranged on the object side, and a grating structure to be arranged on the image side, and to a method for wavefront measurement of an optical imaging system by means of a phase-shifting interferometry technique, wherein a phase-shifting structure and a detector element are moved laterally relative to the optical imaging system to be measured.

BACKGROUND AND OBJECTS OF THE INVENTION

Devices and methods of this type serve the purpose, for example, of determining the imaging quality and/or image errors of high-resolution optical imaging systems interferometrically with high precision. An important field of application is the corresponding measurement of projection objectives in microlithography exposure machines for semiconductor component patterning. Interferometry techniques used for this purpose are shearing interferometry, by means of which the wavefront measurement device disclosed in Laid-open Patent Application DE 101 09 929 A1, for example, operates, and point diffraction interferometry. In this case, the device can be integrated in the system in which the imaging system is used in its normal operation, and it can use for measurement the same radiation of a radiation source present in the system as it is used in normal operation of the imaging system. In this case, the interferometer is denoted as an operational interferometer or OI device.

It is known in the case of these phase-shifting interferometry techniques for wavefront measurement that the phase-shifting structure, for example a diffraction grating, to be arranged on the image side, with a one-dimensional or two-dimensional diffraction grating structure, or a so-called coherence mask, to be arranged on the object side, with a one-dimensional or two-dimensional coherence mask structure, is moved laterally relative to the optical imaging system to be measured, in order to determine the spatial derivative of the measured wavefront in the relevant lateral direction, from which it is then possible to obtain image error information relating to the imaging system, in particular spatially resolved image error information relating to the entire pupil of the imaging system, typically in the form of so-called Zernike coefficients. Here, the designation "one- or two-dimensional" means structures which are periodic in one or in two non-parallel directions, and consequently lead in the diffraction diagram to the diffraction patterns in one or in two non-parallel directions.

For this purpose, for example, spatial derivatives in two mutually orthogonal directions such as the x- and y-directions of an xyz coordinate system with a z-axis pointing in the direction of the optical axis of the system are determined by using a two-dimensional coherence mask to be arranged on the object side, and a two-dimensional diffraction grating structure corresponding thereto. In addition to the stepwise, relatively slow lateral displacement, for example of the diffraction grating structure for the purpose of effecting the phase shift in the direction in which the spatial derivative of the interferogram or of the wavefront is to be measured, for example in the x-direction, it is preferred to provide an in contrast much faster lateral movement of the phase-shifting structure in the direction perpendicular thereto, such as the y-direction, in order to suppress effects by interference between undesired diffraction orders in this orthogonal direction. The interferogram image recorded by the detector element on the detection plane during this fast movement is integrated such that the undesired interference is averaged out as far as possible.

Frequently the downstream detection part and, in particular, the image recording detector element are also laterally displaced synchronously with the phase-shifting structure, for example in a fashion implemented by a design with a motionally rigid coupling of the phase-shifting structure and detector element. This fixed coupling permits a relatively compact design of the wavefront-measuring interferometer part. Particularly for this type of system with motionally rigid coupling of the phase-shifting structure and detector element, however, when use is made of the method, conventional for this purpose of evaluating the wavefront interoferograms, it is observed that there is a limitation of the accuracy which can be achieved for the wavefront measurement, and this is to be ascribed to the fact that the image of the pupil of the imaging system to be measured migrates during the measurement operation in the detection plane of the detector element in conjunction with the synchronous lateral movement of the phase-shifting structure and detector element. This is the case, specifically, with systems which do not use a sine corrected imaging optical system between the phase-shifting structure and the detector element, and holds both for the abovementioned slow lateral movement in the direction to be measured, and for the fast movement in the direction, orthogonal thereto, for suppressing the undesired interference. The pupil migration also occurs when the object-side mask structure is laterally displaced, while the detector element remains undisplaced, and leads with the conventional evaluation methods to a spatial "blurring" of the measured wavefronts, and thus to a so-called "crosstalk" between different Zernike coefficients, in particular Zernike coefficients with large radial powers are underweighted.

The technical problem on which the invention is based is to provide a device and a method of the type mentioned at the beginning which specifically permits comparatively accurate wavefront measurement of an optical imaging system even when the pupil image of the measured imaging system migrates on the detection plane of the detector element owing to a coupled lateral movement of the phase-shifting structure and detector element, or a lateral movement of an object-side mask relative to the detector element.

SUMMARY OF THE INVENTION

The invention solves this problem by providing a device that is distinguished in that one or more structure patterns of different dimensionality are respectively selected for the mask structure to be arranged on the object side, on the one hand, and the grating structure to be arranged on the image side, on the other hand, that is to say one or more one-dimensional mask structure patterns for the object-side mask structure, and one or more two-dimensional grating structure patterns for the image-side grating structure or, conversely, one or more two-dimensional mask structure patterns for the mask structure, and one or more one-dimensional grating structure patterns for the grating structure. This suppresses as far as possible undesired interference in a non-parallel, for example orthogonal direction to the measuring direction, which interference mostly has the largest fraction of Zernike crosstalk, for geometrical reasons by limiting the mask structure or the grating structure to one or more one-dimensional structure patterns. This measure can therefore replace the conventional fast phase-shift in this non-parallel direction.

The invention solves this problem further by providing a wavefront measuring method which includes a computational consideration of the offset of the pupil position by back calculating the interferogram, respectively recorded by the detector element, using a phase-shifting characteristic associated with the phase-shifting lateral movement, or by a computational correction of wavefront derivatives, obtained from the recorded interferograms, in the direction of lateral movement. This computational elimination of the measuring error caused by the pupil position offset results in a high measuring accuracy in the determination of image errors by the wavefront measurement even in the case of migration movements of the pupil position on the detection plane.

In a specific refinement of this mode of procedure, the computational correction of the wavefront derivatives is formed as a function of pupil position by means of an approximation algorithm which is relatively easy to apply and with the aid of which it is possible to take account of adequately, or to compensate the influence of the pupil position offset, in any event for the slow phase shift movement in the measuring direction.

The disturbing influence in a non-parallel direction can be adequately suppressed, for example in a refinement of the invention, by carrying out the inventive method with the aid of the inventive device. As mentioned above, the mask-displacing or phase-shifting grating structure, limited to one-dimension, of the device renders a fast phase-shifting movement in a non-parallel direction superfluous, so that also no corresponding need arises to compensate a pupil position offset in this direction. Alternatively, the pupil position offset for the fast phase-shifting movement in a non-parallel direction can be compensated by back calculating the recorded interferogram with the aid of the associated phase-shifting characteristic.

BRIEF DESCRIPTION OF THE DRAWINGS

Advantageous embodiments of the invention are illustrated in the drawings and will be described below. In the drawings:

FIGS. 6 and 7 show top views of two multiline grating coherence mask structures for the x-direction and y-direction, respectively, which can be used in the device of FIG. 1, in conjunction with the chessboard diffraction grating of FIG. 5, FIG. 8 shows a schematic illustration of the cooperation of the two-dimensional chessboard diffraction grating of FIG. 5 with the one-dimensional coherence mask multiline grating of FIG. 6.

DETAILED DESCRIPTION OF THE PREFERRED EMBODIMENTS

Figure 1:
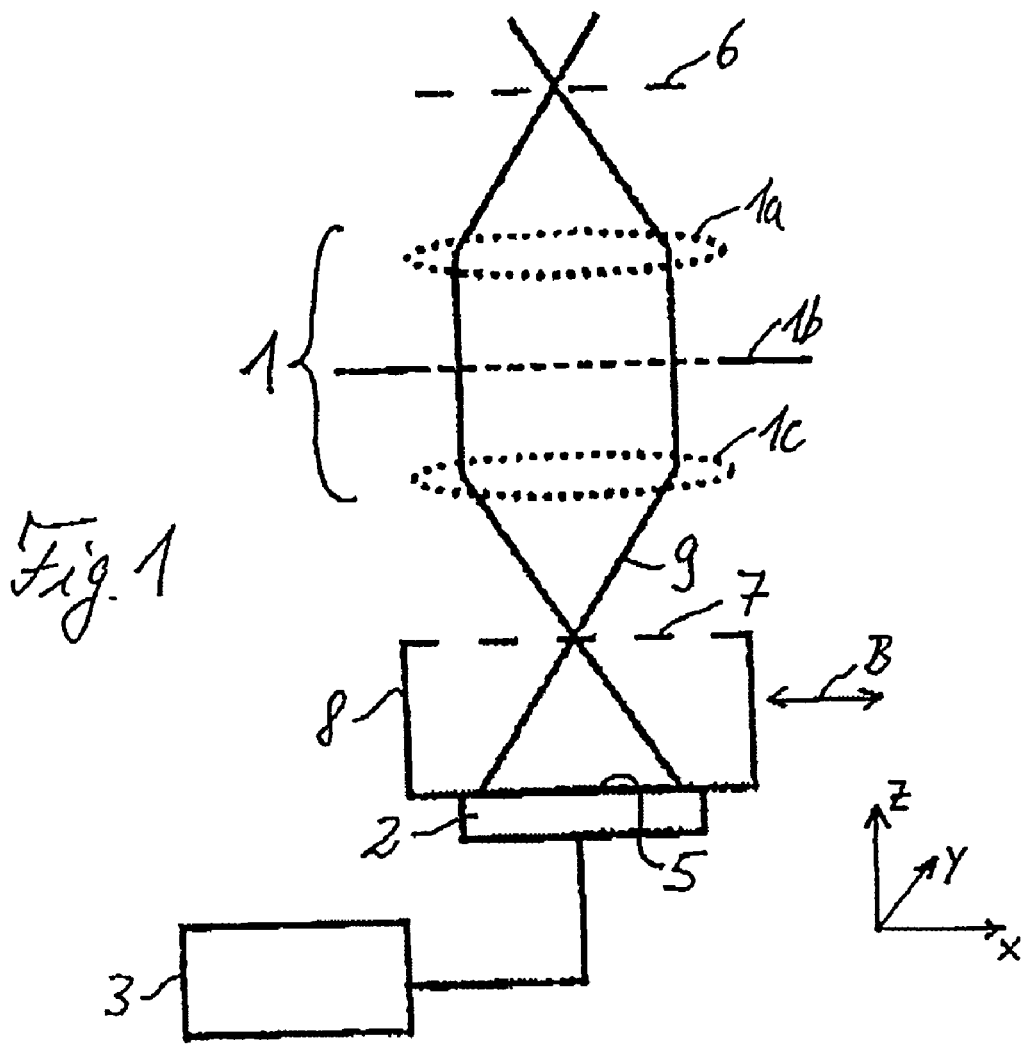
FIG. 1 shows a schematic side view of a device for wavefront measurement by means of shearing interferometry.

FIG. 1 illustrates a typical design of a device for wavefront measurement by means of shearing interferometry for the purpose of determining image errors and, in particular aberrations, using the example of a projection objective 1 of a microlithography projection exposure machine as optical imaging system to be measured. The objective 1 is represented in a simplified fashion by an object-side lens 1a, an objective pupil 1b and an image-side lens 1c. A coherence mask 6 is arranged on object side, preferably in the object plane of the objective 1. In a fashion corresponding thereto, a phase-shifting diffraction grating 7 is arranged on the image side, preferably in the image plane of the objective 1, such that it can move laterally in the xy-plane orthogonal to the z-direction of the optical axis of the system. The distorted pupil of the objective 1 is imaged onto a detector element 2, more precisely onto a detection plane 5 of the same. Coupled to the detector element 2, which can be, for example, a CCD detector of an image recording camera, is an evaluation unit 3 in which the image processing and evaluation algorithms are implemented such as are known to be required for determining image errors by evaluating the wavefront interferograms recorded by the detector element 2.

In the example of FIG. 1, the detector element 2 is coupled to the phase-shifting diffraction grating 7 in a motionally rigid fashion in the form of a common phase-shifting and detector component 8.

Figure 2:
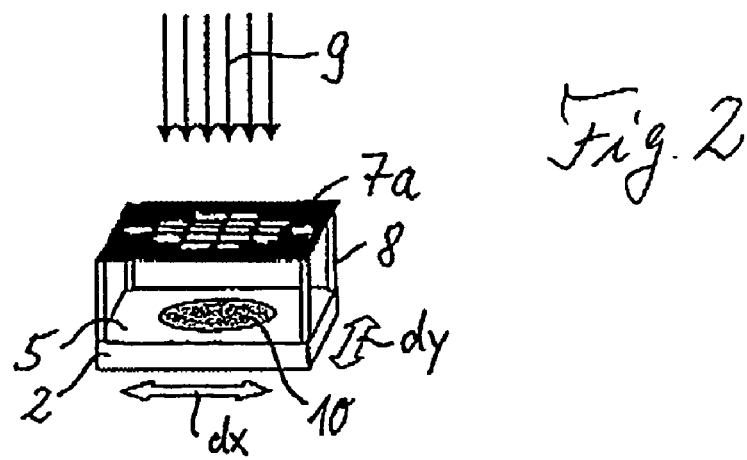
FIG. 2 shows a perspective view of a phase-shifting and detection part of the device of FIG. 1.

The lateral movement of the diffraction grating 7, symbolized in FIG. 1 with a motion arrow B serves the purpose of stepwise phase shifting for the shearing interferometry measurement, as a result of which the successively recorded interferograms can be used to determine the spatial derivative of the wavefront in the relevant lateral direction, and therefrom the image errors of the measured objective 1, that is known per se and requires no more detailed explanation here. The coupled displacement of the detector element 2 together with the phase-shifting diffraction grating 7 produces an offset of the pupil image, that is to say a corresponding lateral migration movement of the same, on the detection plane 5. This is illustrated more precisely in FIG. 2 to 4. FIG. 2 shows diagrammatically the phase-shifting and detection module 8 with a two-dimensional chessboard diffraction grating 7a during a measurement operation. The measuring radiation 9 coming from the objective to be measured is diffracted by the chessboard diffraction grating 7a in the x- and y-directions, the respective diffraction maximum corresponding to an associated pupil image patch 10 on the detection plane 5. For the sake of simplicity, only the zero diffraction maximum is illustrated in FIG. 2.

Figure 3:
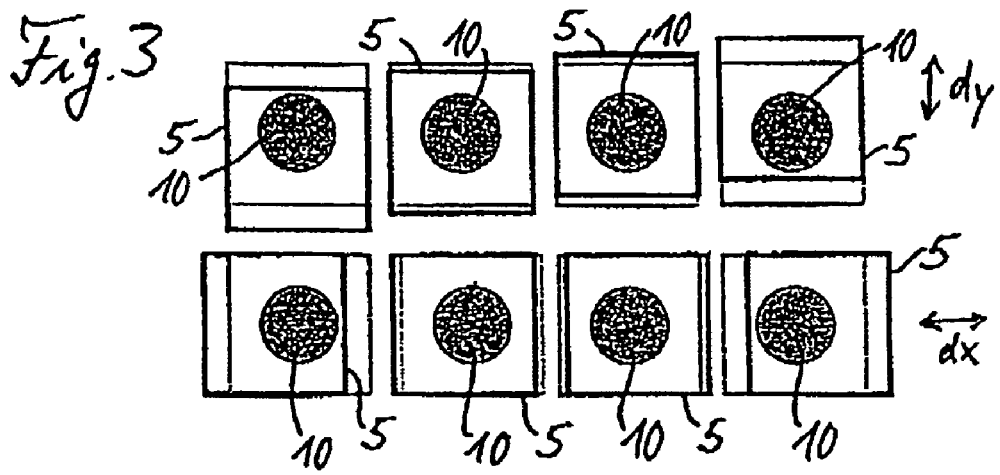
FIG. 3 shows schematic top views of a detection plane of the phase-shifting and detection part of FIG. 2 during stepwise phase-shifting movements in two orthogonal directions.

In an upper row of four top views of the detection plane 5 in different y-positions of the phase-shifting and detection module 8, and in a lower row of four such individual energies for different x-positions of this module 8, FIG. 3 shows the migration movement of the pupil image patch 10 on the detection surface 5 on the basis of the phase-shifting lateral movement of the diffraction grating 7, and thus also of the detector element 2 coupled to it.

Figure 4:
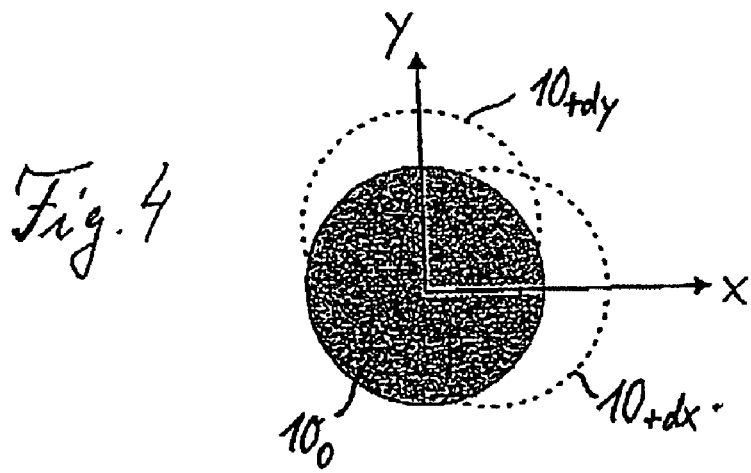
FIG. 4 shows a schematic illustration of the migration movement of the pupil image for the xy phase-shifting movements of FIG. 3.

Shown diagrammatically in FIG. 4 is this pupil image offset between a central position $10_0$ of the pupil image patch and respectively one position $10_{+dx}$ displaced in the positive x-direction, and one position $10_{+dy}$ displaced in the positive y-direction.

The pupil image offset in the x-direction occurs when the diffraction grating 7 is displaced stepwise in this direction in order to effect the phase shift in this direction, and thereby to determine the spatial derivative of the wavefront in the x-direction, for example. As is known per se, there is frequently superimposed on this movement a by contrast fast movement of the diffraction grating 7, and thus also of the detection plane 5 in the direction orthogonal thereto, that is to say, y-direction in this case, with the aid of which there are averaged out and thereby suppressed diffraction orders which also occur in this direction given an assumed two-dimensionality of the diffraction grating 7 and coherence mask 6 but which are not desired when determining the wavefront spatial derivatives in the x-direction. Conversely, when measuring in the y-direction the stepwise, comparatively slow movement in the y-direction has a fast movement in the x-direction superimposed on it in order to suppress the diffraction orders in the x-direction which are disturbing in this case.

The pupil offset occurring in the xy-plane owing to the abovementioned lateral movements of the diffraction grating 7 and detector element 5 relative to the imaging system 1 to be measured supplies a corresponding error contribution in the evaluation of the recorded shearing interferogram for the determination of wavefront, and thus of image errors. The same goes not only for the shearing interferometry technique shown here by way of example, but also for all other conventional interferometry techniques where for the purpose of the wavefront measurement of an imaging system a lateral movement of a phase-shifting structure, in particular a diffraction grating structure, and of a detection plane coupled thereto is undertaken for the purpose of phase shifting, as in the case of point diffraction interferometry, for example. A pupil offset also occurs in systems for which the phase shifting is effected by a lateral movement of the object-side mask structure, like the coherence mask structure 6 of FIG. 1, relative to the detection plane. Such systems and associated measurement methods in which the object-side mask structure functions as phase-shifting structure are consequently likewise the subject matter of the invention. Merely for the sake of simplicity, the invention is explained below with reference again to the example with the image-side diffraction grating 7 as phase-shifting structure.

The error contribution is typically expressed in the so-called crosstalk of Zernike coefficients. A wavefront described by specific Zernike coefficients is coupled by the pupil image offset to other, mostly lower Zernike coefficients.

The invention takes account of this error contribution in determining the image error by avoiding it as far as possible by skilful selection of the mask structure to be arranged on the object side and the grating structure to be arranged on the image side, and/or compensating it as far as possible computationally. These measures, which avoid the pupil offset error as far as possible or compensate it computationally, will be examined in more detail below with reference to FIG. 5 to 12.

Figure 5:
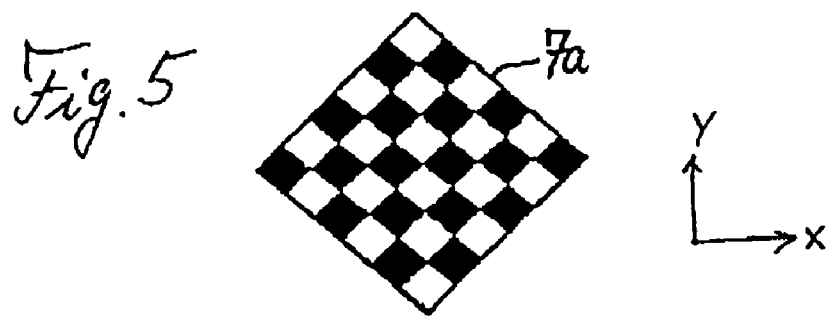
FIG. 5 shows a schematic top view of a chessboard diffraction grating which can be used in the device of FIG. 1 as phase-shifting structure.

A first remedial measure consists in selecting a different dimensionality for the mask structure to be arranged on the object side, the coherence mask structure 6 in the example in FIG. 1, on the one hand, and for the image-side grating structure, the diffraction grating structure 7 in the device of FIG. 1, on the other hand, that is to say selecting a one-dimensional periodic structure for one element and a two-dimensional periodic structure for the other element instead of, as is conventional, a two-dimensional structure for both elements. To this end, FIG. 5 to 8 show an example in which the two-dimensional chessboard diffraction grating 7a in accordance with FIG. 2 is selected as diffraction grating 7, as depicted in FIG. 5, while one one-dimensional multiline mask structure 6a, 6b each is optionally used for the coherence mask 6, as illustrated in FIGS. 6 and 7. The two multiline grating mask structures 6a, 6b are used here, as reproduced in the correct position in FIGS. 6 and 7 with reference to the diffraction grating illustration of FIG. 5, with mutually orthogonal directions of periodicity which are in each case parallel to one of the two orthogonal chessboard directions of periodicity of the chessboard diffraction grating 7a. Specifically, the multiline grating mask 6a of FIG. 6 with direction of periodicity in the x-direction, and the multiline grating mask 6b of FIG. 7 with direction of periodicity in the y-direction are to be arranged on the object side in the device of FIG. 1.

FIG. 8 shows the effect of these measures of different dimensionality of the phase-shifting structure and wavefront-producing coherence mask structure with reference to the example of the chessboard diffraction grating 7a of FIG. 5 in combination with the coherence mask multiline grating 6a of FIG. 6. As illustrated diagrammatically in FIG. 8, the latter leads to an intensity coherence function modulated in the x-direction, while the chessboard diffraction grating 7a supplies diffraction maxima both along the x-axis and along the y-axis of the diffraction diagram, as is likewise depicted diagrammatically in FIG. 8. Combination of two periodic structures with one-dimensional and two-dimensional periodicity results in lasting diffraction orders in the x-direction which are capable of interference, as depicted in the lowermost component image of FIG. 8. The diffraction orders in the y-direction are suppressed.

The arrangement of FIG. 8 is therefore suitable for interferometric measurement with phase-shifting along the x-direction, the in this case possibly disturbing diffraction orders of the chessboard diffraction grating 7a in the y-direction being suppressed. A fast, averaging-out movement of the chessboard diffraction grating 7a in the y-direction is therefore not required. In the same way, the wavefront measurement can be performed by phase-shifting in the y-direction using the coherence mask multiline grating 6b of FIG. 7 instead of the multiline grating 6a of FIG. 6, disturbing diffraction orders in the x-direction 10 being then suppressed.

Since this geometrical structural measure eliminates the fast, averaging-out lateral movement of the phase-shifting structure in the direction not parallel to the measuring direction, there is also no occurrence of the pupil image offset, caused thereby, in this direction, and therefore no occurrence of a corresponding error contribution. The pupil image offset error contribution resulting from the stepwise phase-shifting movement in the measuring direction can be corrected computationally if required, and this will be examined in more detail further below.

Instead of the two-fold chessboard grating 7a, it is possible depending on requirement to use another two-dimensional grating structure with n-fold geometry, it being possible in each case to suppress interference of undesired diffraction orders by using a one-dimensional coherence mask. As a further example of this type, FIGS. 9 and 10 show a triangular diffraction grating 7b as phase-shifting grating structure, and this can lead to a rise in accuracy of the wavefront measurement, for example in a hexagonal parcelling of the pupil of the objective to be measured in conjunction with the determination of the spatial derivatives in the three shearing directions of this three-fold triangular grating structure 7b.

Figure 9:
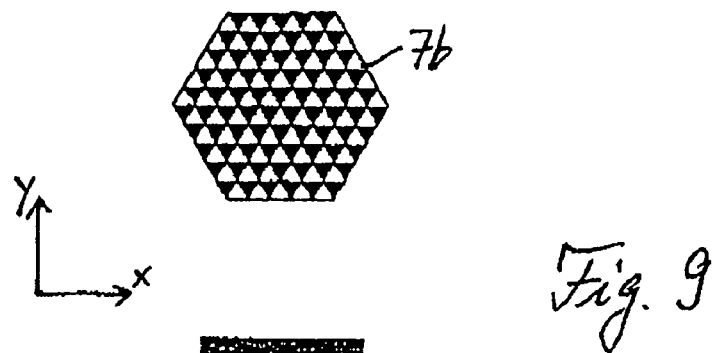
FIG. 9 shows a schematic top view of a two-dimensional triangular diffraction grating and of three one-dimensional coherent mask multiline gratings, arranged correspondingly in position, for use in the device of FIG. 1.
Figure 9:

As shown further in FIG. 9, the triangular diffraction grating 7b is optionally combined with one one-dimensional coherence mask multiline grating 6c, 6d, 6e each, which are orientated such that their direction of periodicity coincides in each case with one of the three directions of periodicity of the triangular grating 7b which are inclined at 120° to one another. Consequently, by using one each of the three multiline gratings 6c, 6d, 6e as coherence mask, the diffraction orders of the phase-shifting triangular gratings 7b are filtered out in the relevant direction of periodicity, while the diffraction orders in the two other directions of periodicity are suppressed. In the orientation shown in FIG. 9, one of the three directions of periodicity of the triangular grating lies in the y-direction, and this corresponds to the direction of periodicity of a first coherence mask multiline grating 6c, while the directions of periodicity of the two other coherence mask multiline gratings 6d, 6e are at an angle of +120° and −120' thereto.

Figure 10:
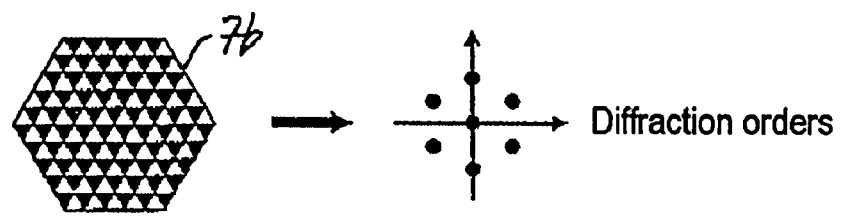
FIG. 10 shows a schematic illustration corresponding to FIG. 8 for the two-dimensional triangular diffraction grating, and one of the three associated coherent mask multiline gratings of FIG. 9.
Figure 10:
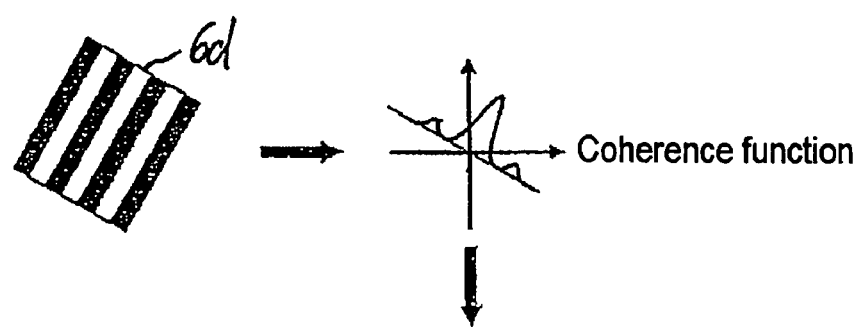

FIG. 10 illustrates the use of one of the multiline gratings 6d as coherence masks in combination with the triangular grating 7b as phase-shifting structure. In a fashion similar to the above described example of FIG. 8, FIG. 10 illustrates the selection of the interference-capable diffraction orders by the relevant multiline grating 6d with the aid of its coherent function, intensity-modulated in the associated direction of the periodicity, from the diffraction orders, lying in the three directions of periodicity, of the triangular grating 7b. It is thereby possible, in turn, to determine the wavefront derivatives in the relevant measuring direction, and simultaneously to suppress disturbing interference of diffraction orders of the two other directions of periodicity of the triangular grating 7b, without this requiring a rapid, averaging-out lateral movement of the triangular grating 7b in these directions in addition to the stepwise phase-shifting movement in the measuring direction.

As explained above, it is thereby possible by combining a two-dimensional grating structure to be arranged on the image side with a one-dimensional wavefront-generating structure to be arranged on the object side to dispense with the average-out fast displacement movement which otherwise contributes the largest fraction of the Zernike crosstalk. It goes without saying that the same effect can be achieved in alternative embodiments of the invention by combining a two-dimensional, object side, wavefront-generating mask structure with a one-dimensional image-side grating structure. It is also obvious that the coherence mask and/or the image-side grating structure can include in each case, in a conventional way per se, a plurality of one- or two-dimensional patterns arranged, for example, next to one another or superimposed on one another.

Alternatively, or in addition to this geometrical structural measure, it is possible to provide a computational correction of the error contribution which results from the offset of the pupil position in the detection plane owing to the coupled lateral movement of phase-shifting structure and detection plane, or from the lateral relative movement of the object-side mask and detection plane.

The following two methods principally come into consideration for the computational correction of this error contribution. In a first variant, there is a back calculation of the displacement, caused by the pupil image offset, of the individual interferograms detected by the detector element, that is to say the pupil of the measured imaging system is back calculated. This is readily possible by a suitable conventional correction algorithm by feeding it the associated phase shift characteristic as input information. The said characteristic is, however, prescribed for effecting this stepwise phase-shifting lateral movement, and is therefore known. This computational correction method can be used to compensate both the error contribution owing to the stepwise, slow lateral movement for phase shifting in the measuring direction, and any error contribution owing to an averaging-out, fast lateral movement in a direction not parallel to the measuring direction. A precondition for the application of this correction method is the use of a detector element with a very high resolution, or an interpolation of the individual recorded interferograms, since the lateral displacement is not necessarily an integral multiple of a detection plane pixel of the detector element.

As a further variant, it is possible for the purpose specifically of compensating the error contribution owing to the slow, stepwise phase shifting movement to make use of a computational correction method in which the measured spatial derivatives on the wavefront in the respective measuring direction are corrected in a pixelwise fashion employing an algorithm, relatively easy to execute, which is an approximation algorithm entirely adequate for the desired purpose.

Figure 11:
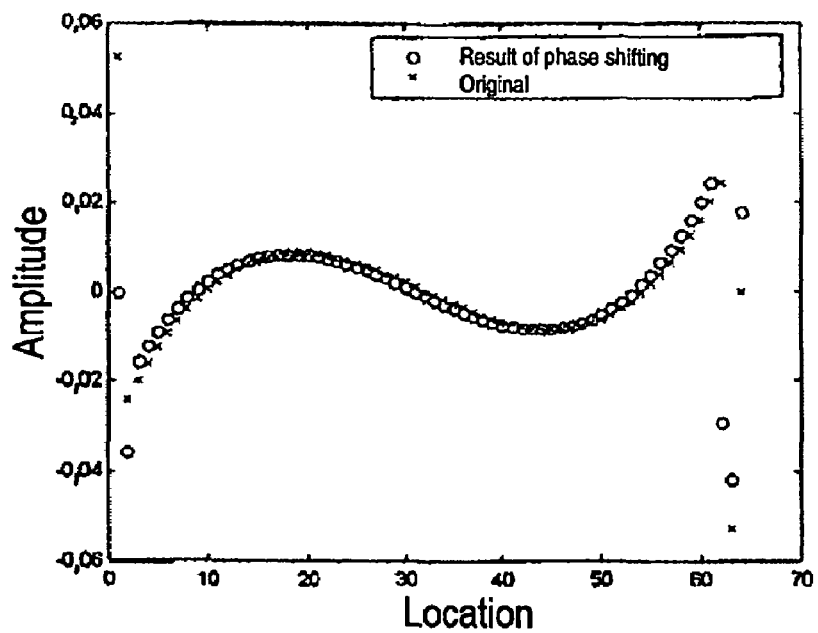
FIG. 11 shows a characteristic diagram for illustrating the influence of the pupil position offset on measurement operations with the aid of the device of FIG. 1 for the Zernike coefficient Z9.

The necessity and expediency of correcting the error contribution caused by the slow phase-shifting movement is illustrated diagrammatically firstly in FIG. 11 with reference to the example of the influence on the derivative of the wavefront for the Zernike coefficient Z9. The characteristic "original" marked by the cross symbols denotes (as section Z9) the wavefront derivative of the Zernike coefficient Z9 measured without accompanying movement of the detection plane with the phase-shifting structure, whereas by comparison therewith the characteristic "result of the phase shift" marked by the circle symbols denotes the wavefront derivative obtained by the accompanying movement. The latter derivative clearly leads the "original" characteristic. The result is a crosstalk of the Zernike coefficient Z9 into the Zernike coefficients Z5 and Z6 as well as Z2 and Z3 for the wavefront reconstructed from the x- and y-derivatives, respectively.

The computational correction method which is specifically useful for compensating the error contribution from the slow phase-shifting movement proceeds from the following relationship (I) of the intensity modulation $I^{(1)}$ as a function of the nth phase shift, that is to say the associated "slow" phase curve for a respective pixel, taking account of the accompanying movement of the detection plane with the phase-shifting structure relative to the imaging system to be measured:

$$I^{(1)}(n) = \cos\left(S_x + \frac{\partial S_x}{\partial x} \frac{\Delta x(n-1)}{N} + \frac{2\pi(n-1)}{N}\right), \quad (I)$$

N denoting the total number of phase steps, a phase shift performed over $2\pi$, and $S_x$ denoting the derivative of the wavefront in the x-direction, which is measured at a point in the detection plane when there is no accompanying movement of the detection plane. The x-direction is adopted thereby as measuring direction without limitation of generality. Δx denotes the lateral displacement of the detection plane during the phase shifting in the x-direction. By evaluating the intensity values $I^{(1)}$ on the individual pixels over the entire pupil, for example by means of Fourier transformation, it is possible to determine the wavefront derivative $S_x^{(1)}$ which includes the error contribution owing to the accompanying movement of the detector, which originates from the error terms $(\partial S_x/\partial x)(\Delta x(n-1)/N)$. A very far reaching compensation of this error contribution is achieved with the aid of the following relationship (II):

$$I^{(2)}(n) = \cos\left(S_x^{(1)} - \frac{\partial S_x^{(1)}}{\partial x}\frac{\Delta x(n-1)}{N} + \frac{2\pi(n-1)}{N}\right), \quad (II)$$

$I^{(2)}$ constituting the corrected intensity value of the individual pixel as a function of the nth phase shift, and $S_x^{(1)}$ constituting the wavefront derivative explained above and obtained by evaluating the errored intensity values $I^{(1)}$. These intensity values $I^{(2)}$ are then used to calculate the associated corrected wavefront derivative $S_x^{(2)}$ in turn, for example by means of Fourier transformation. In other words, in this correctional algorithm use is made of the information contained in the derivative of $S_x^{(1)}$ to correct $S_x^{(1)}$ in order to determine the wavefront derivative $S_x^{(2)}$ corrected for pupil offset.

Higher derivatives of $S_x$ are neglected in this approximation algorithm, which is justified without loss of accuracy as long as the displacement Δx is not exceeded by a certain amount. This condition is fulfilled for most cases of practical importance. As mentioned, this computational correction method is suitable specifically for compensating the pupil offset error contribution of the "slow" phase shift in the measuring direction. Of course, the correction algorithm specified above for the x-direction as measuring direction can also be applied in a similar way for other measuring directions.

Figure 12:
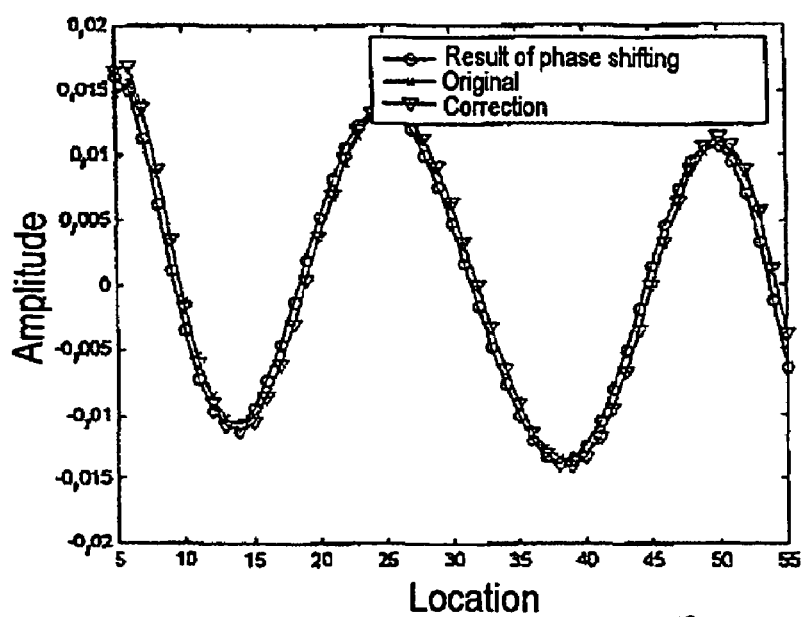
FIG. 12 shows a characteristic diagram for illustrating a computational correction of the influence of the pupil position offset during measurement operations with the aid of the device of FIG. 1 for the Zernike coefficient Z25.

FIG. 12 illustrates the effect of this computational correction method in increasing accuracy with reference to the example of the derivative of the Zernike coefficient Z25 in the x-direction. The accompanying movement of the detection plane with the phase-shift structure leads to crosstalk to other Zernike coefficients such that, in a way similar to FIG. 11, the characteristic "result of the phase shift" with the detection plane moving in accompaniment deviates from the characteristic "original" without a detection plane moving in accompaniment. The characteristic "correction" marked with triangular symbols reproduces the result of the computational correction in accordance with the correction algorithm explained above. It may be seen that the correction method is capable of compensating as far as possible the error contribution caused by pupil offset.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all such changes and modifications as fall within the spirit and scope of the invention, as defined by the appended claims, and equivalents thereof.

What is claimed is:

1. A method for wavefront measurement of an optical imaging system by means of a phase-shifting interferometry technique, the method comprising:
   at least one of:
       moving a phase-shifting structure and a detector element laterally relative to the optical imaging system to be measured, and
       moving an object-side mask structure laterally relative to the detector element,
   wherein a pupil image offset occurring owing to the relative lateral movement is taken into account by back calculating interferograms, wherein the interferograms are respectively recorded by the detector element, using a phase-shifting characteristic associated with the lateral movement, or
   wherein the pupil image offset is taken into account by a computational correction of wavefront derivatives, obtained from the recorded interferograms, in the direction of lateral movement.

2. The method according to claim 1, wherein the computational correction of wavefront derivatives in the direction of lateral movement is performed using the relationship:

$$I^{(2)}(n) = \cos\left(S_x^{(1)} - \frac{\partial S_x^{(1)}}{\partial x}\frac{\Delta x(n-1)}{N} + \frac{2\pi(n-1)}{N}\right),$$

which specifies the intensity values $I^{(2)}$ of individual detector element pixels as a function of the nth lateral phase shift with $S_x^{(1)}$ as errored wavefront derivative in the phase-shifting direction, from which an error-corrected wavefront derivative ($S_x^{(2)}$) is then calculated, wherein N denotes a total number of phase steps.

3. The method according to claim 1, carried out with aid of a device comprising:
   a mask structure which is arranged on an object side, and
   a grating structure which is arranged on an image side,
   wherein the mask structure which is arranged on the object side comprises one or more mask structure patterns with a periodicity in exactly one direction, and the grating structure to be arranged on the image side comprises one or more grating structure patterns with a periodicity in exactly two non-parallel directions, or
   wherein the mask structure comprises one or more mask structure patterns with a periodicity in exactly two non-parallel directions, and the grating structure comprises one or more grating structure patterns with a periodicity in exactly one direction.

4. The method according to claim 2, carried out with aid of a device comprising:
   a mask structure which is arranged on an object side, and
   a grating structure which is arranged on an image side,
   wherein the mask structure which is arranged on the object side comprises one or more mask structure patterns with a periodicity in exactly one direction, and the grating structure to be arranged on the image side comprises one or more grating structure patterns with a periodicity in exactly two non-parallel directions, or
   wherein the mask structure comprises one or more mask structure patterns with a periodicity in exactly two non-parallel directions, and the grating structure comprises one or more grating structure patterns with a periodicity in exactly one direction.

* * * * *